(12) United States Patent
Zou et al.

(10) Patent No.: US 11,537,182 B2
(45) Date of Patent: Dec. 27, 2022

(54) DISPLAY PANEL, CHIP, AND FLEXIBLE CIRCUIT BOARD

(71) Applicant: WUHAN CHINA STAR OPTOELECTRONICS TECHNOLOGY CO., LTD., Hubei (CN)

(72) Inventors: Gonghua Zou, Hubei (CN); Yucheng Lu, Hubei (CN); Xiang Yang, Hubei (CN)

(73) Assignee: WUHAN CHINA STAR OPTOELECTRONICS TECHNOLOGY CO., LTD, Hubei (CN)

( * ) Notice: Subject to any disclaimer, the term of this patent is extended or adjusted under 35 U.S.C. 154(b) by 199 days.

(21) Appl. No.: 16/625,814

(22) PCT Filed: May 20, 2019

(86) PCT No.: PCT/CN2019/087583
§ 371 (c)(1),
(2) Date: Dec. 23, 2019

(87) PCT Pub. No.: WO2020/211142
PCT Pub. Date: Oct. 22, 2020

(65) Prior Publication Data
US 2021/0294394 A1  Sep. 23, 2021

(30) Foreign Application Priority Data

Apr. 15, 2019 (CN) .......................... 201910301424.4

(51) Int. Cl.
*G06F 1/18* (2006.01)
*H05K 1/11* (2006.01)

(52) U.S. Cl.
CPC .............. *G06F 1/189* (2013.01); *G06F 1/183* (2013.01); *H05K 1/118* (2013.01); *H05K 2201/10128* (2013.01)

(58) Field of Classification Search
CPC .......... G06F 1/189; G06F 1/183; H05K 1/118
See application file for complete search history.

(56) References Cited

U.S. PATENT DOCUMENTS

| 10,381,594 B2 * | 8/2019 | Jiang .................... H01L 51/0097 |
| 2009/0086114 A1 * | 4/2009 | Higuchi .............. G02F 1/13338 349/12 |

(Continued)

FOREIGN PATENT DOCUMENTS

| CN | 1387633 A | 12/2002 |
| CN | 101477970 A | 7/2009 |
| CN | 106571116 A | 4/2017 |

*Primary Examiner* — Fred Tzeng
(74) *Attorney, Agent, or Firm* — Soroker Agmon Nordman

(57) ABSTRACT

The present invention discloses a display panel, a chip and a flexible circuit board. The display panel includes a panel body and at least two signal transmission circuits. The signal transmission circuit includes a line input terminal used for binding to a flexible circuit board, which is disposed at the peripheral area, a signal transmission line, and a line output terminal used for binding to a chip, which is disposed at the peripheral area. At least two of the line output terminals are arranged in a two-dimensional array. The present invention can reduce the impedance of a part of the signal transmission line.

20 Claims, 7 Drawing Sheets

(56) References Cited

U.S. PATENT DOCUMENTS

| | | | |
|---|---|---|---|
| 2011/0216490 A1 | 9/2011 | Ohno et al. | |
| 2012/0169571 A1* | 7/2012 | Wang | G09G 3/36 |
| | | | 345/1.2 |
| 2012/0169578 A1* | 7/2012 | Kim | G09G 3/3688 |
| | | | 345/93 |
| 2017/0338294 A1* | 11/2017 | Choi | H01L 51/0097 |
| 2018/0067354 A1* | 3/2018 | Son | H05K 1/189 |
| 2018/0083211 A1* | 3/2018 | Lee | H01L 27/3246 |
| 2018/0204534 A1* | 7/2018 | Liao | G09G 3/3696 |
| 2019/0281692 A1* | 9/2019 | Jeon | H01L 51/0097 |
| 2020/0166814 A1* | 5/2020 | Guan | G02F 1/13452 |
| 2020/0249721 A1* | 8/2020 | Lu | H01L 27/3248 |
| 2021/0360779 A1* | 11/2021 | Cheng | H05K 1/0277 |

* cited by examiner

DISPLAY PANEL, CHIP, AND FLEXIBLE CIRCUIT BOARD

FIELD OF INVENTION

The present invention relates to the field of display technologies, and in particular, to a display panel, a chip, and a flexible circuit board.

BACKGROUND OF INVENTION

Conventional chip on glass (COG) modules are generally provided with conductive pads for electrically connecting to pins of chips, and the conductive pads are electrically connected to the traces.

In practice, the inventors have found that prior arts have at least the following problems:

As the number of conductive pads (pins of chips) increase, the conductive pads at the ends away from the chip need to be connected with longer traces. The longer the length of the traces, the greater the impedance. Thus, the impedance-sensitive signal is greatly affected by the impedance of the traces.

Therefore, it is necessary to propose a new technical solution to solve the above technical problems.

SUMMARY OF INVENTION

An object of the present invention is to provide a display panel, a chip, and a flexible circuit board that can reduce the impedance of a portion of the signal transmission line.

In order to solve the above problems, the technical solutions of the present invention are as follow:

A display panel comprises a panel body having a display area and a peripheral area disposed on at least one side of the display area, and at least two signal transmission circuits disposed at the peripheral area. The signal transmission circuit comprises a line input terminal used for binding to a flexible circuit board, which is disposed at the peripheral area, a signal transmission line, and a line output terminal used for binding to a chip, which is disposed at the peripheral area. Two ends of the signal transmission line are electrically connected to the line input terminal and the line output terminal. At least two of the line output terminals are arranged in a two-dimensional array.

In the above display panel, at least two of the line output terminals comprise a first sub-combination and a second sub-combination, the line output terminals in the first sub-combination are arranged in a first direction, and the line output terminals in the second sub-combination are arranged in a second direction.

In the above display panel, the first direction and the second direction are the same direction. The first direction is a direction parallel to or perpendicular to a line corresponding to an edge of the peripheral area.

In the above display panel, the line output terminals in the first sub-combination and the line output terminals in the second sub-combination are parallel arranged. At least a portion of the signal transmission line electrically connected to the line output terminals of the first sub-combination and the line output terminals of the second sub-combination is disposed between the line output terminals of the first sub-combination and the line output terminals of the second sub-combination.

In the above display panel, the line output terminals in the first sub-combination are staggered with the line output terminals in the second sub-combination. At least a portion of the signal transmission line electrically connected to the line output terminal of the second sub-combination is disposed between two adjacent line output terminals of the first sub-combination.

In the above display panel, the first direction and the second direction intersect. The first direction has a first angle with a line corresponding to an edge of the peripheral area, and the second direction has a second angle with a line corresponding to an edge of the peripheral area.

In the above display panel, at least two line output terminals of the first sub-combination are arranged in a step shape, and at least two line output terminals of the second sub-combination are arranged in a step shape.

In the above display panel, a line input terminal combination having at least two of the line input terminals is disposed on at least one side of a line output terminal combination having at least two of the line output terminals in a direction parallel to a line corresponding to an edge of the peripheral area.

In the above display panel, at least two of the line input terminals are arranged in a one-dimensional array. An arrange direction of at least two of the line input terminals parallel to a line corresponding to an edge of the peripheral area.

In the above display panel, at least two of the line input terminals are arranged in a one-dimensional array. A third angle is disposed between the arrange direction of at least two of the line input terminals and a line corresponding to an edge of the peripheral area.

In the above display panel, at least two of the line input terminals are arranged in a stepped shape.

In the above display panel, the display panel further comprises the chip disposed at the peripheral area of the panel body. The chip comprises a chip body that is elongated, and at least two input pins that are arranged in a two-dimensional array. The input pin is bound to the line output terminal.

In the above display panel, the display panel further comprises a flexible circuit board, an end of the flexible circuit board is disposed at the peripheral area of the panel body. The flexible circuit board comprises a flexible circuit board body and at least two output pads that are exposed on a surface of the flexible circuit board body. The at least two output pads are arranged in a one-dimensional linear array. The output pad is bound to the line input terminal.

A chip suitable for a display panel, comprises a chip body that is elongated, and at least two input pins that are arranged in a two-dimensional array. The input pin is bound to the line output terminal.

In the above chip, an input pin combination having at least two input pins is disposed adjacent to an end of the chip body.

In the above chip, an arrangement of the at least two input pins and an arrangement of the at least two line output terminals are the same, and a relative position of the two input pins on the surface of the chip body corresponds to a relative position of the two line output terminals at the peripheral area.

A flexible circuit board suitable for use in a display panel, comprises a flexible circuit board body, and at least two output pads that are exposed on a surface of the flexible circuit board body. The at least two output pads are arranged in a one-dimensional linear array. The output pad is bound to the line input terminal.

In the above flexible circuit board, an output pad combination having at least two output pads is disposed adjacent to an end of the flexible circuit board body.

In the above flexible circuit board, an arrangement of the at least two input pins and an arrangement of the at least two line output terminals are the same, and a relative position of the two input pins on the surface of the chip body corresponds to a relative position of the two line output terminals at the peripheral area.

In the above flexible circuit board at least two of the output pads are arranged along an edge line of an end of the flexible circuit board body, and an edge of the output pad is aligned with an edge of an end of the flexible circuit board body.

In the above technical solution, since at least two of the line output terminals are arranged in a two-dimensional array, the length of the signal transmission line electrically connected to the part of the line output terminals can be reduced. That is, the above technical solution shortens the wiring distance between a part of the line output terminal and the line input terminal. Therefore, the length of the signal transmission line is shortened, the impedance of the signal transmission line is reduced, and power loss and signal attenuation are reduced.

In order to make the above description of the present invention more comprehensible, the preferred embodiments are described below, and are described in detail below with reference to the accompanying drawings.

DESCRIPTION OF DRAWINGS

The technical solutions and other advantageous effects of the present invention will be apparent from the following detailed description of embodiments of the invention.

In the drawings.

DETAILED DESCRIPTION OF PREFERRED EMBODIMENTS

The term "embodiment" as used in this specification means an example, a sample or an illustration. In addition, the articles "a" or "an" generally can be interpreted as "one or more," unless otherwise specified or the singular form can be clearly determined.

A display panel of the present invention may be a thin film transistor liquid crystal display (TFT-LCD), an organic light emitting diode (OLED), or the like.

Figure 1:
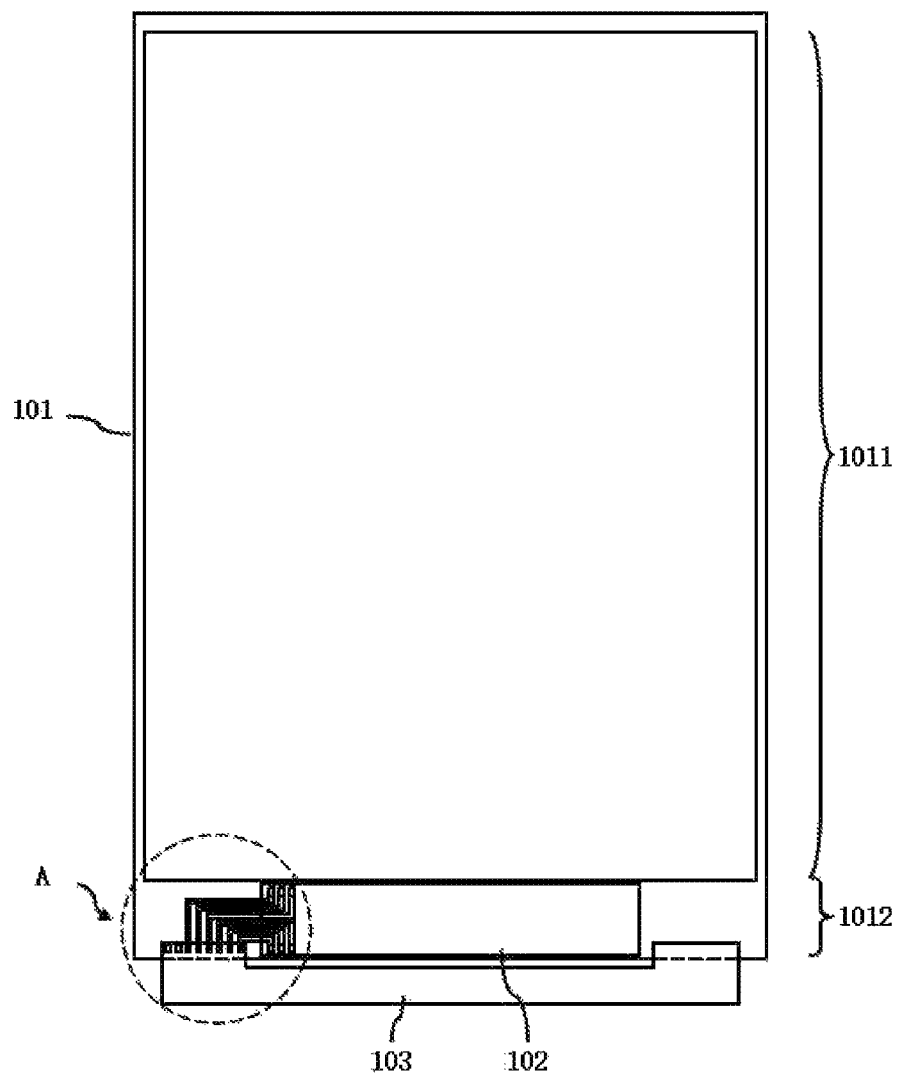
FIG. 1 is a schematic view of a first embodiment of a display panel of the present invention.
Figure 2:
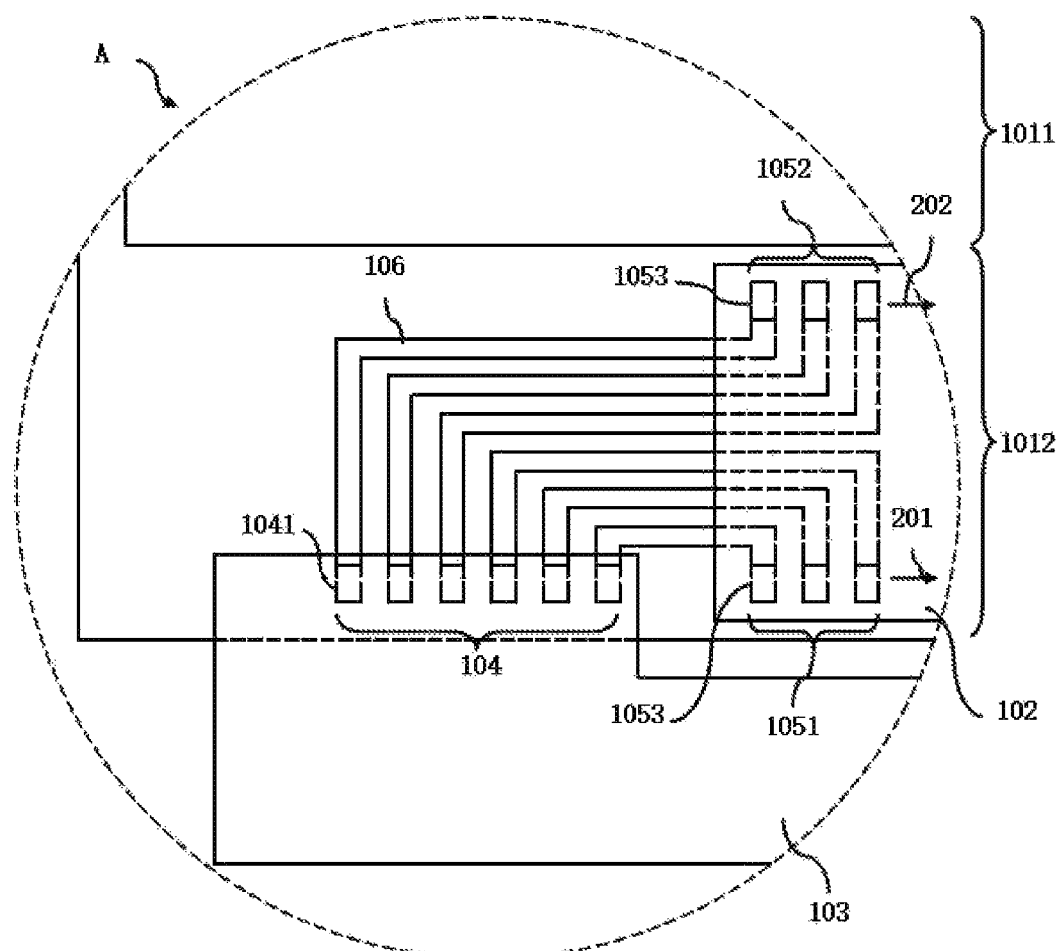
FIG. 2 is a schematic view of an area A in the display panel shown in FIG. 1.
Figure 3:
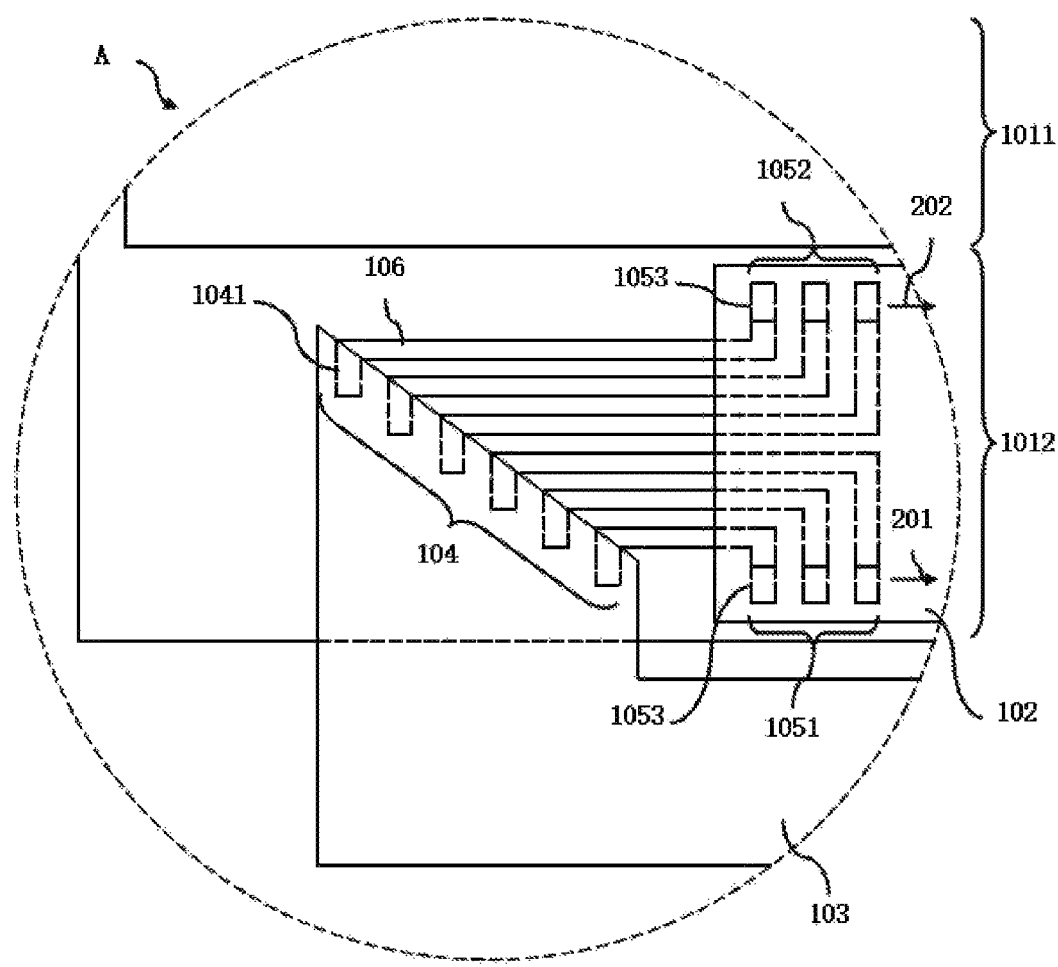
FIG. 3 to FIG. 5 are schematic diagrams showing other three arrangement modes of the line input terminals in the area A shown in FIG. 2.
Figure 4:
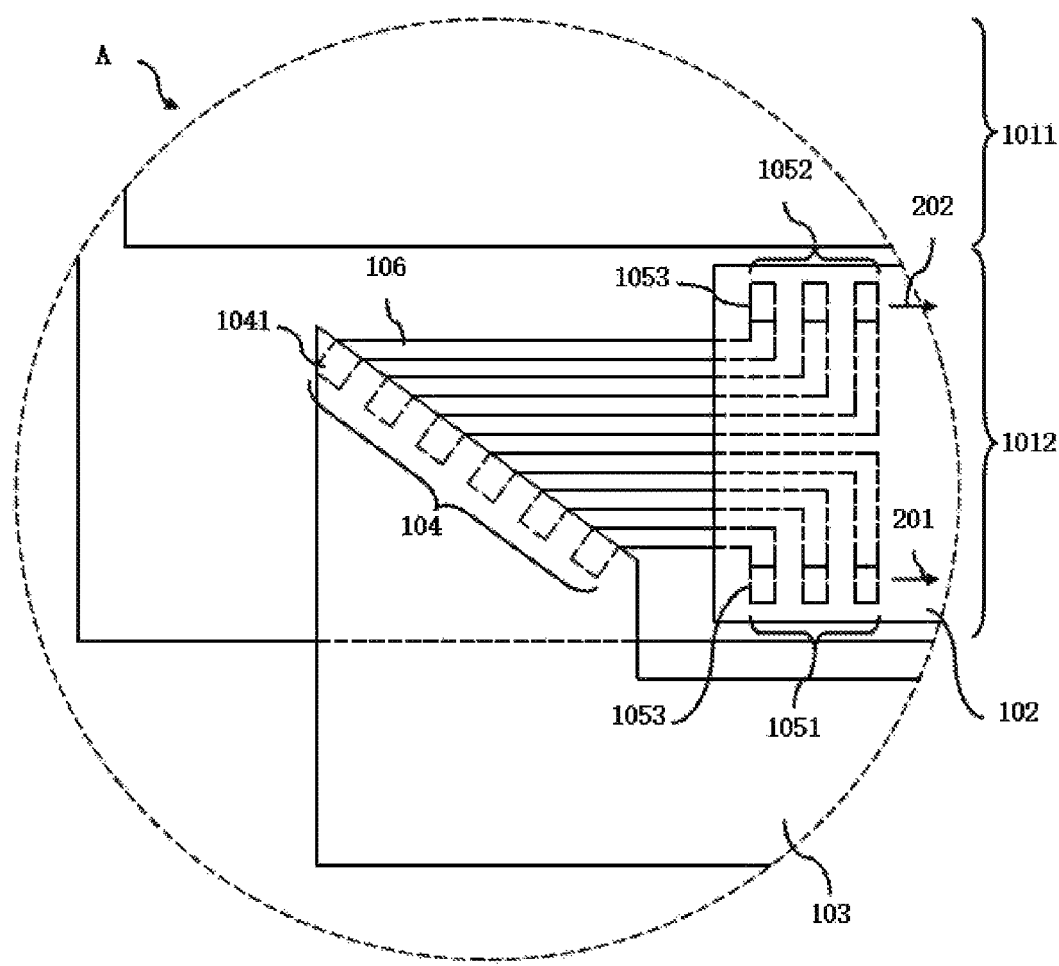
Figure 5:
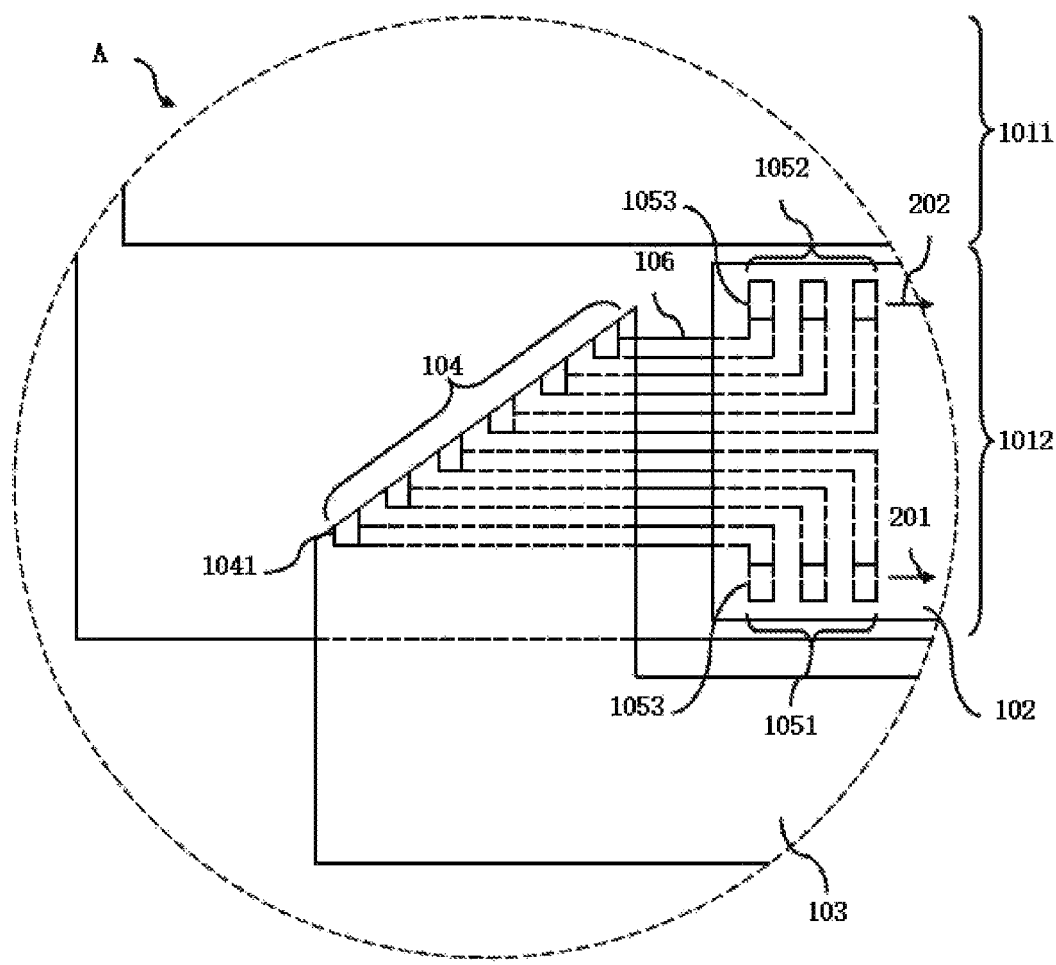

Please refer to FIG. 1 and FIG. 5. FIG. 1 is a schematic view of a first embodiment of a display panel of the present invention. FIG. 2 is a schematic view of an area A in the display panel shown in FIG. 1. FIG. 3 to FIG. 5 are schematic diagrams showing other three arrangement modes of the line input terminals in the area A shown in FIG. 2.

The display panel of the embodiment comprises a panel body 101 and at least two signal transmission lines. The panel body 101 can be, for example, a chip on glass (COG) module.

The panel body 101 comprises a display area 1011 and a peripheral area 1012 disposed on at least one side of the display area 1011. For example, the peripheral area 1012 is disposed on one side of the short side of the display area 1011.

The signal transmission circuits are disposed at the peripheral area 1012. The signal transmission circuit comprises a line input terminal 1041 used for binding to a flexible circuit board 103, which is disposed at the peripheral area 1012, a signal transmission line 106, and a line output terminal 1053 used for binding to a chip 102, which is disposed at the peripheral area 1012. Two ends of the signal transmission line 106 are electrically connected to the line input terminal 1041 and the line output terminal 1053. At least two of the signal transmission lines 106 are parallel arranged.

At least two of the line output terminals are arranged in a two-dimensional array. The two-dimensional array comprises a linear or non-linear arrangement in a two-dimensional coordinate system. For example, a first sub-combination 1051 and a second sub-combination 1052 of at least two of the line output terminals 1053 are parallel arranged, or staggered, or cross-arranged.

The signal transmission line is used to receive a signal from the flexible circuit board 103 through the line input terminal 1041, and to output the signal to the chip 102 through the line output terminal 1053.

At least a portion of the line input terminal 1041 and at least a portion of the line output terminal 1053 are exposed on a surface of the panel body 101.

At least two of the line output terminals 1053 comprise the first sub-combination 1051 and the second sub-combination 1052. The line output terminals 1053 in the first sub-combination 1051 are arranged along a first direction 201, and the line output terminals 1053 in the second sub-combination 1052 are arranged in the second direction 202.

In this embodiment, the first direction 201 and the second direction 202 are the same direction.

The first direction 201 is a direction parallel to a line corresponding to an edge of the peripheral area 1012. Alternatively, the first direction 201 is a direction perpendicular to a line corresponding to an edge of the peripheral area 1012.

The line output terminals 1053 in the first sub-combination 1051 and the line output terminals 1053 in the second sub-combination 1052 are parallel arranged.

At least a portion of the signal transmission line 106 electrically connected to the line output terminals 1053 of the first sub-combination 1051 and the line output terminals 1053 of the second sub-combination 1052 is disposed between the line output terminals 1053 of the first sub-combination 1051 and the line output terminals 1053 of the second sub-combination 1052 that are parallel arranged.

A line input terminal combination 104 having at least two of the line input terminals 1041 is disposed on at least one side of a line output terminal combination 1053 having at least two of the line output terminals 1053 in a direction parallel to a line corresponding to an edge of the peripheral area 1012.

At least two of the line input terminals 1041 are arranged in a one-dimensional array.

As shown in FIG. 2, an arrange direction of at least two of the line input terminals 1041 parallel to a line corresponding to an edge of the peripheral area 1012. Alternatively, as shown in FIGS. 3, 4, and 5, a third angle is disposed between the arrange direction of at least two of the line input terminals 1041 and a line corresponding to an edge of the peripheral area 1012, which is advantageous for shortening the wiring distance between the line input terminal 1041 and the line output terminal 1053. That is, the length of the signal transmission line 106 is shortened, so that the impedance of the signal transmission line 106 can be reduced, thereby reducing power loss and signal attenuation.

In a case where the third angle is disposed between the arrange direction of at least two of the line input terminals 1041 and a line corresponding to an edge of the peripheral area 1012, at least two of the line input terminals 1041 are arranged in a stepped shape.

The display panel further comprises the chip 102. The chip 102 is disposed at the peripheral area 1012 of the panel body 101. The chip 102 comprises a chip body and at least two input pins.

The chip body is elongated. The chip body is disposed at a position close to an edge of the peripheral area 1012 (i.e. a position away from the display area 1011).

The input pin is disposed on a surface (for example, a bottom surface) of the chip body. The at least two input pins are arranged in a two-dimensional array. An arrangement of the at least two input pins and an arrangement of the at least two line output terminals 1053 are the same, and a relative position of the two input pins on the surface of the chip body corresponds to a relative position of the two line output terminals 1053 at the peripheral area 1012. Further, an input pin combination including at least two input pins is disposed at a position close to an end of the chip body. That is, the input pin is disposed at an edge portion of one end of the elongated chip body.

The input pin is bound to the line output terminal 1053. The input pin is for receiving the signal provided by the signal transmission line from the line output terminal 1053 and providing the signal to the chip body.

The display panel further comprises a flexible circuit board 103. An end of the flexible circuit board 103 is disposed at the peripheral area 1012 of the panel body 101. The flexible circuit board 103 comprises a flexible circuit board body and at least two output pads.

At least two output pads are exposed on a surface of the flexible circuit board body, and at least two of the output pads are arranged in a one-dimensional linear array. An arrangement of the at least two input pins and an arrangement of the at least two line output terminals are the same, and a relative position of the two input pins on the surface of the chip body corresponds to a relative position of the two line output terminals 1041 at the peripheral area 1012.

The output pad is bound to the line input terminal 1041. The output pad is for outputting a signal provided by the flexible circuit board 103 to the line input terminal 1041.

An output pad combination including at least two output pads is disposed adjacent to an end of the flexible circuit board body. At least two of the output pads are arranged along an edge line of an end of the flexible circuit board body, and an edge of the output pad is aligned with an edge of an end of the flexible circuit board body. Wherein the edge line of the end of the flexible circuit board body is parallel to a line corresponding to the edge of the peripheral area 1012 (as shown in FIG. 2), or the edge line of the end of the flexible circuit board body has a fourth angle with the line corresponding to the edge of the peripheral area 1012 (as shown in FIG. 3, FIG. 4, FIG. 5). Wherein the edge line of the end of the flexible circuit board body faces the line output terminal 1053 or faces away from the line output terminal 1053.

As shown in FIG. 2, an arrange direction of at least two of the output pads is parallel to a line corresponding to an edge of the peripheral area 1012. Alternatively, as shown in FIGS. 3, 4, and 5, a fourth angle is disposed between the arrange direction of at least two of the output pads and a line corresponding to an edge of the peripheral area 1012, which is advantageous for shortening the wiring distance between the line input terminal 1041 and the line output terminal 1053. That is, the length of the signal transmission line 106 is shortened, so that the impedance of the signal transmission line 106 can be reduced, thereby reducing power loss and signal attenuation.

The display panel further comprises at least two data lines and at least two data signal input terminals. The data lines are electrically connected to the data signal input terminals, and the data line is also electrically connected to the pixel unit of the panel body 101 in the display area 1011.

The data signal input terminal is for binding to the chip 102 to be disposed at the peripheral area 1012.

At least two of the data signal input terminals are arranged in a one-dimensional array in a direction parallel to a line corresponding to an edge of the peripheral area 1012.

Figure 6:
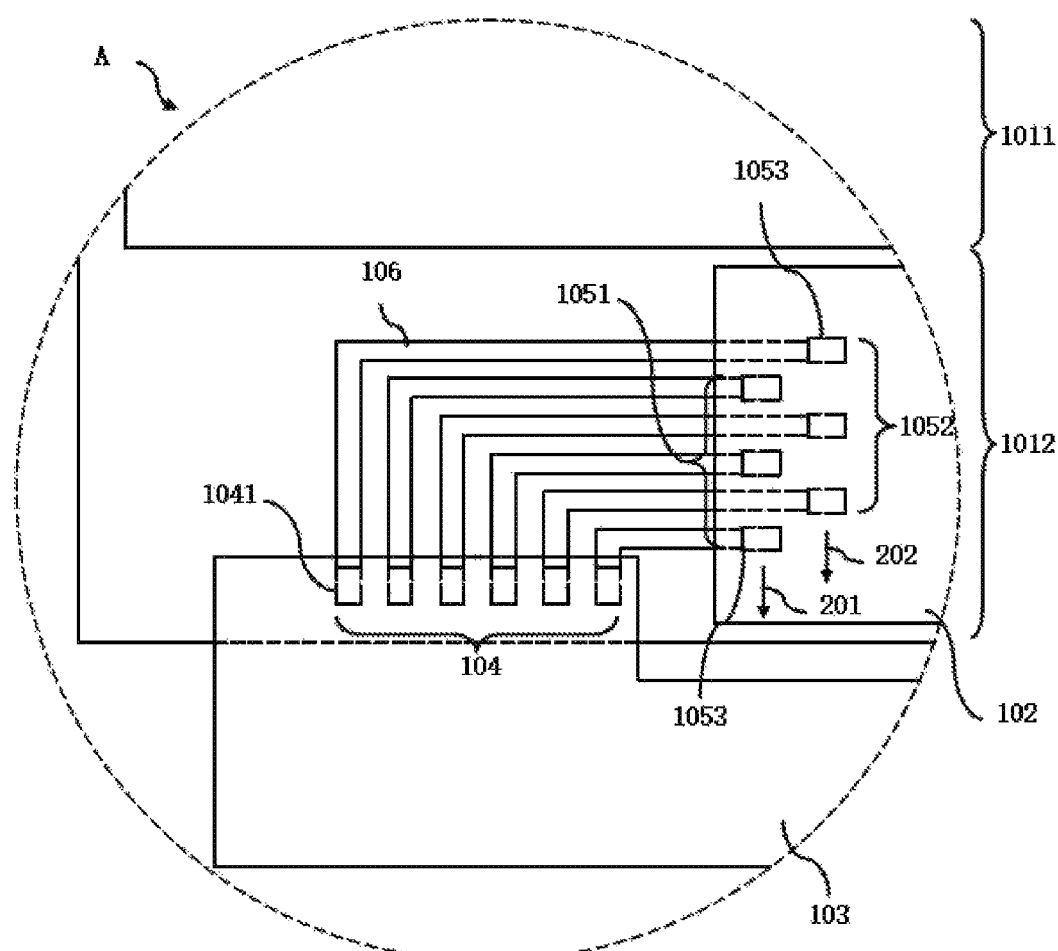
FIG. 6 is a schematic view of an area A in a second embodiment of the display panel of the present invention.

Referring to FIG. 6. FIG. 6 is a schematic view of an area A in a second embodiment of the display panel of the present invention. This embodiment is similar to the first embodiment described above, except that:

In the first embodiment described above, the line output terminals 1053 in the first sub-combination 1051 are parallel arranged with the line output terminals 1053 in the second sub-combination 1052.

In this embodiment, the line output terminals 1053 in the first sub-combination 1051 are staggered with the line output terminals 1053 in the second sub-combination 1052. That is, a position of the line output terminals 1053 in the second sub-assembly 1052 corresponds to a position of the gap between the two line output terminals 1053 in the first sub-assembly 1051. A signal transmission line 106 connected to the line output terminal 1053 in the second sub-assembly 1052 passes through the gap between the two line output terminals 1053 in the first sub-assembly 1051. At least a portion of the signal transmission line 106 electrically connected to the line output terminal 1053 of the second sub-assembly 1052 is disposed between adjacent two line output terminals 1053 of the first sub-assembly 1051.

Figure 7:
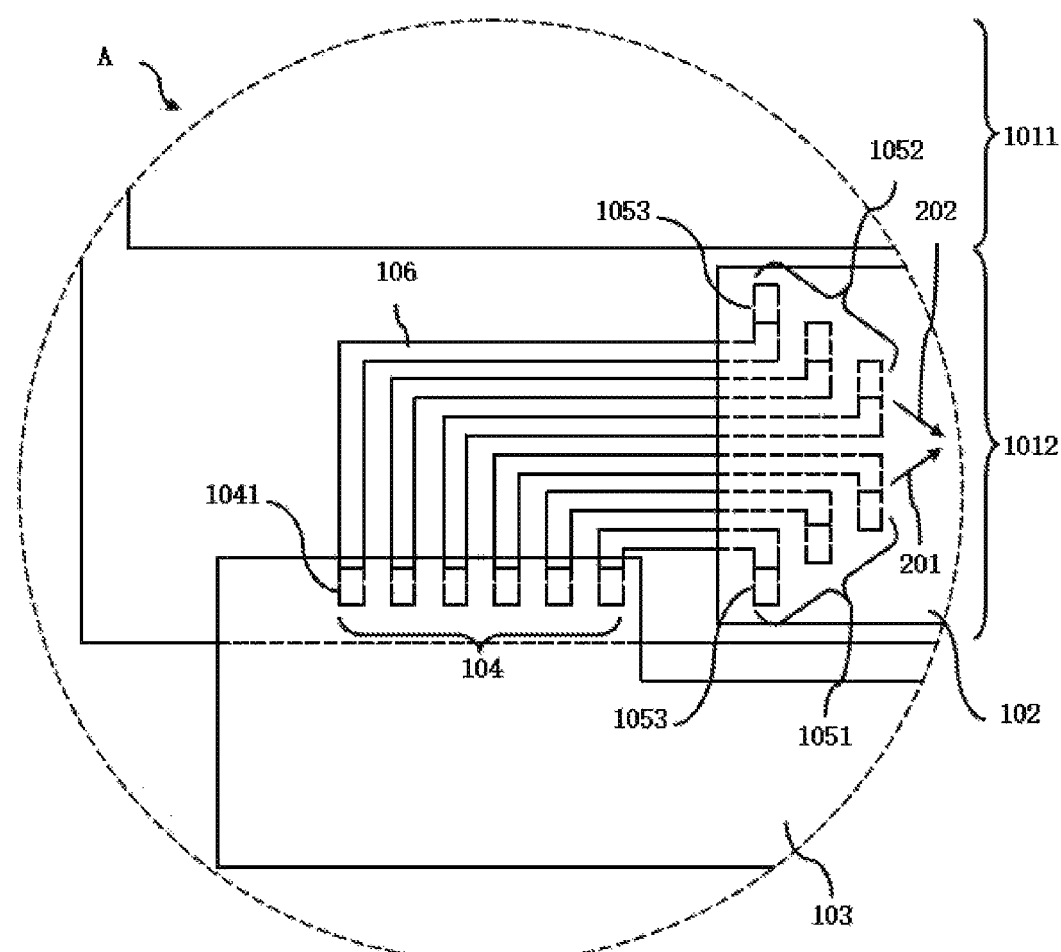
FIG. 7 is a schematic view of an area A in a third embodiment of the display panel of the present invention.

Referring to FIG. 7. FIG. 7 is a schematic view of an area A in a third embodiment of the display panel of the present invention. This embodiment is similar to the first embodiment or the second embodiment described above, except that:

In the first embodiment or the second embodiment described above, the first direction 201 and the second direction 202 are the same.

However, in this embodiment, the first direction 201 and the second direction 202 intersect. The first direction 201 has a first angle with a line corresponding to the edge of the peripheral area 1012, and the second direction 202 has a second angle with a line corresponding to the edge of the peripheral area 1012. That is, an arrange direction of the line output terminals 1053 in the first sub-assembly 1051 and an arrange direction of the line output terminals 1053 in the second sub-combination 1052 are not parallel.

At least two line output terminals 1053 of the first sub-combination 1051 are arranged in a stepped shape; and/or at least two line output terminals 1053 of the second sub-combination 1052 are arranged in a stepped shape.

In the above technical solution, since at least two of the line output terminals 1053 are arranged in a two-dimensional array, the length of the signal transmission line 106 electrically connected to the portion of the line output terminal 1053 can be reduced. That is, the above technical solution shortens the wiring distance between a part of the line output terminal 1053 and the line input terminal 1041. Therefore, the length of the signal transmission line 106 is shortened, the impedance of the signal transmission line 106 is reduced, and power loss and signal attenuation are reduced.

In summary, although the present invention has been disclosed above in the preferred embodiments, the above preferred embodiments are not intended to limit the present invention. People skilled in the art can make various modifications and refinements without departing from the spirit and scope of the invention, and the scope of the invention is defined by the scope defined by the claims.

What is claimed is:

1. A display panel, comprising:
    a panel body, the panel body comprising a display area and a peripheral area disposed on at least one side of the display area;
    a flexible circuit board comprising a horizontal portion and a vertical portion protruding from an end of the horizontal portion in a direction crossing the horizontal portion, wherein the horizontal portion and the peripheral area are spaced apart from each other, and the vertical portion extends toward the peripheral area and to overlap the peripheral area;
    a chip disposed at the peripheral area and between the horizontal portion and the display area, wherein the chip comprises a first side facing the horizontal portion and a second side crossing the first side and facing the vertical portion; and
    at least two signal transmission wiring portions disposed at the peripheral area and connecting the flexible circuit board and the chip, wherein each of the at least two signal transmission wiring portions comprises a line input terminal, a line output terminal, and a signal transmission line between the line input terminal and the line output terminal, the line input terminal is bonded to the vertical portion, and the line output terminal is bonded to the second side of the chip, wherein two ends of the signal transmission line are electrically connected to the line input terminal and the line output terminal respectively;
    wherein at least two line output terminals of the at least two signal transmission portions are arranged in a two-dimensional array, and at least two line input terminals of the at least two signal transmission portions are arranged in a one-dimensional array.

2. The display panel as claimed in claim 1, wherein at least two of the line output terminals comprise a first sub-combination and a second sub-combination, the line output terminals in the first sub-combination are arranged in a first direction, and the line output terminals in the second sub-combination are arranged in a second direction.

3. The display panel as claimed in claim 2, wherein the first direction and the second direction are the same direction;
    wherein the first direction is a direction parallel to or perpendicular to a line corresponding to an edge of the peripheral area.

4. The display panel as claimed in claim 3, wherein the line output terminals in the first sub-combination and the line output terminals in the second sub-combination are parallel arranged; and
    at least a portion of the signal transmission line electrically connected to the line output terminals of the first sub-combination and the line output terminals of the second sub-combination is disposed between the line output terminals of the first sub-combination and the line output terminals of the second sub-combination that are parallel arranged.

5. The display panel as claimed in claim 3, wherein the line output terminals in the first sub-combination are staggered with the line output terminals in the second sub-combination; and
    at least a portion of the signal transmission line electrically connected to the line output terminal of the second sub-combination is disposed between two adjacent line output terminals of the first sub-combination.

6. The display panel as claimed in claim 2, wherein the first direction and the second direction intersect; and
    wherein the first direction has a first angle with a line corresponding to an edge of the peripheral area, and the second direction has a second angle with a line corresponding to an edge of the peripheral area.

7. The display panel as claimed in claim 6, wherein at least two line output terminals of the first sub-combination are arranged in a step shape; and
    at least two line output terminals of the second sub-combination are arranged in a step shape.

8. The display panel as claimed in claim 1, wherein a line input terminal combination having at least two of the line input terminals is disposed on at least one side of a line output terminal combination having at least two of the line output terminals in a direction parallel to a line corresponding to an edge of the peripheral area.

9. The display panel as claimed in claim 1, wherein an arrange direction of at least two of the line input terminals parallel to a line corresponding to an edge of the peripheral area.

10. The display panel as claimed in claim 1, wherein a third angle is disposed between the arrange direction of at least two of the line input terminals and a line corresponding to an edge of the peripheral area.

11. The display panel as claimed in claim 10, wherein at least two of the line input terminals are arranged in a stepped shape.

12. The display panel as claimed in claim 1, wherein the chip further comprises:
    a chip body, which is elongated; and
    at least two input pins at the second side of the chip, the at least two input pins are arranged in a two-dimensional array;
    wherein the input pin is bound to the line output terminal.

13. The display panel as claimed in claim 1, wherein the flexible circuit board comprises:
    a flexible circuit board body comprising the horizontal portion and the vertical portion; and
    at least two output pads disposed on the vertical portion, the at least two output pads are exposed on a surface of the flexible circuit board body, and the at least two output pads are arranged in a one-dimensional linear array;
    wherein the output pad is bound to the line input terminal.

14. A chip suitable for a display panel as claimed in claim 1, comprising:
    a chip body, which is elongated; and
    at least two input pins at the second side of the chip, the at least two input pins are arranged in a two-dimensional array;
    wherein the input pin is bound to the line output terminal.

15. The chip as claimed in claim 14, wherein an input pin combination having at least two input pins is disposed adjacent to an end of the second side of the chip body.

16. The chip as claimed in claim 14, wherein an arrangement of the at least two input pins and an arrangement of the at least two line output terminals are the same, and a relative position of the two input pins on the surface of the chip body corresponds to a relative position of the two line output terminals at the peripheral area.

17. A flexible circuit board suitable for use in a display panel as claimed in claim 1, comprising:
- a flexible circuit board body comprising the horizontal portion and the vertical portion; and
- at least two output pads disposed on the vertical portion, the at least two output pads are exposed on a surface of the flexible circuit board body, and the at least two output pads are arranged in a one-dimensional linear array;
- wherein the output pads are correspondingly bonded to the line input terminals.

18. The flexible circuit board as claimed in claim 17, wherein an output pad combination having at least two output pads is disposed adjacent to an end of the vertical portion of the flexible circuit board body.

19. The flexible circuit board as claimed in claim 17, wherein an arrangement of the at least two input pins and an arrangement of the at least two line output terminals are the same, and a relative position of the two input pins on the surface of the chip body corresponds to a relative position of the two line output terminals at the peripheral area.

20. The flexible circuit board as claimed in claim 17, wherein at least two of the output pads are arranged along an edge line of the vertical portion of the flexible circuit board body, and an edge of the output pad is aligned with an edge of the vertical portion of the flexible circuit board body.

* * * * *